Figure 1:
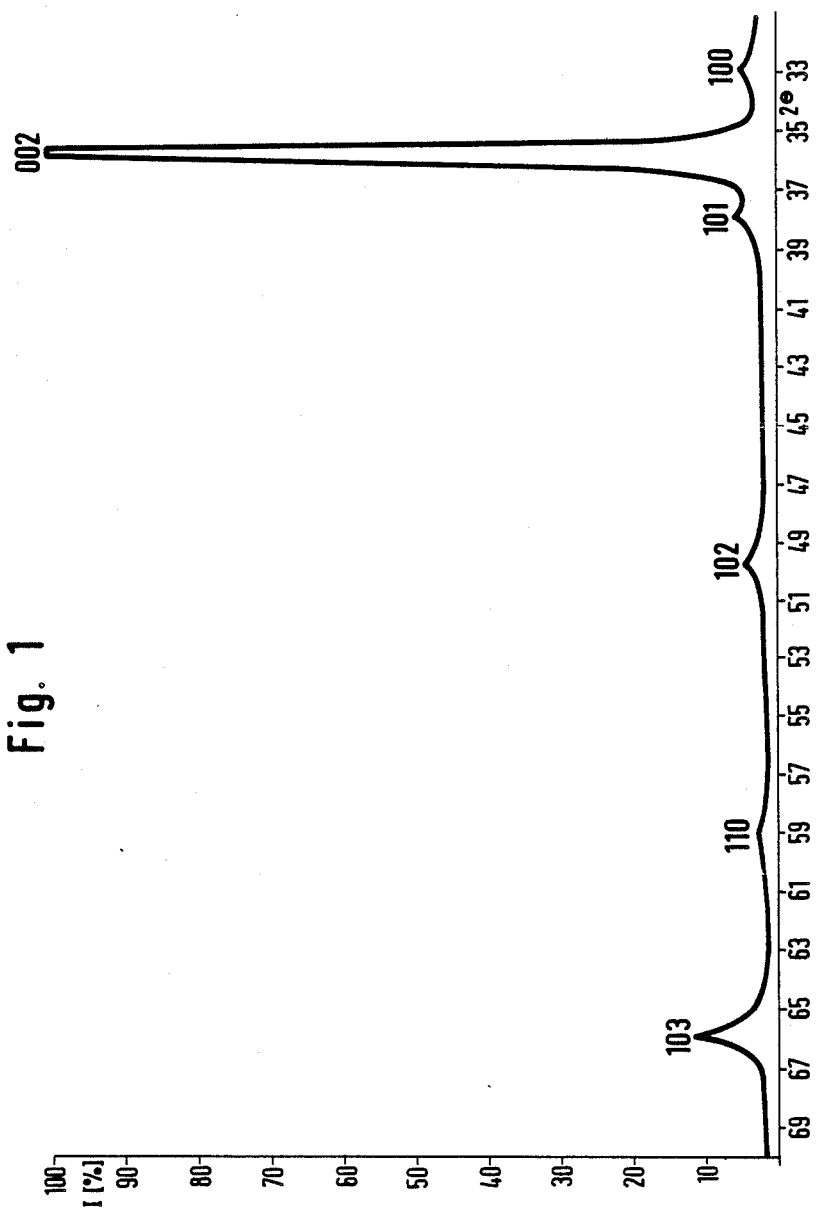

United States Patent [19]

Peters

[11] Patent Number: 4,882,135
[45] Date of Patent: Nov. 21, 1989

[54] PROCESS FOR THE PRODUCTION OF TRANSPARENT ALUMINUM NITRIDE COATINGS FROM AMMINE SALTS OF ALUMINUM IODIDES

[75] Inventor: Dieter Peters, Hürth, Fed. Rep. of Germany

[73] Assignee: Hoechst Aktiengesellschaft, Frankfurt am Main, Fed. Rep. of Germany

[21] Appl. No.: 240,095

[22] Filed: Sep. 2, 1988

[30] Foreign Application Priority Data

Sep. 18, 1987 [DE] Fed. Rep. of Germany ....... 3731455

[51] Int. Cl.$^4$ .......................................... C01B 21/072
[52] U.S. Cl. ........................... 423/412; 156/DIG. 61; 156/DIG. 99
[58] Field of Search ............... 423/412; 156/DIG. 61, 156/DIG. 99

[56] References Cited

U.S. PATENT DOCUMENTS 4,095,331 6/1978 Rutz ..................................... 423/412
4,152,182 5/1979 Rutz ..................................... 423/412
4,172,754 10/1979 Dryburgh .......................... 423/412

OTHER PUBLICATIONS

G. A. Cox et al., "On the Preparation, Optical Properties and Electrical Behavior of Aluminum Nitride", *J. Phys. Chem. Solids*, Pergamon Press, 1967, vol. 28, pp. 543-548.

V. I. Myakinenkov et al., "Preparation of AlN", *Inorganic Materials*, vol. 10, No. 10, pp. 1635-1636, Oct. 1974 (Publ. Mar. 1975), Plenum Publishing Corporation.

George W. Watt et al., "The Ammoniation, Ammonolysis and Hydrolysis of Aluminum (III) Iodide", *J. Amer. Chem. Soc.*, 78 (1956), pp. 5494-5496.

*Primary Examiner*—John Doll
*Assistant Examiner*—Wayne A. Langel

[57] ABSTRACT

A process is given for the production of transparent aluminum nitride coatings in which the aluminum nitride coatings are obtained by evaporation of ammine salts of aluminum iodide in an evaporation zone and subsequent ammonolysis in a decomposition zone at temperatures between 550° and 1200° C.

7 Claims, 2 Drawing Sheets

PROCESS FOR THE PRODUCTION OF TRANSPARENT ALUMINUM NITRIDE COATINGS FROM AMMINE SALTS OF ALUMINUM IODIDES

The invention relates to a process for the production of transparent aluminum nitride coatings.

Aluminum nitride coatings are employed, in particular, as high-temperature materials since they have good properties, such as high thermal conductivity, corrosion resistance and strength. In particular, creep-resistant steels or alloys thereof can be effectively protected against corrosion at temperatures above 600° C.

Hitherto, aluminum nitride coatings have been produced, for example, by an expensive plasma spraying process, by evaporation of aluminum in a nitrogen atmosphere at 1800° to 2000° C., or by application and sintering of aluminum nitride powders having particle diameters of less than 2 µm.

The object was therefore to provide a process for the production of transparent aluminum nitride coatings which is simple and inexpensive to carry out and where the aluminum nitride coatings have a smooth surface having a roughness of less than 0.3 µm.

This object is achieved according to the invention in that the aluminum nitride coatings are obtained by evaporation of ammine salts of aluminum iodide in an evaporation zone and subsequent amminolysis in a decomposition zone at temperatures between 550° and 1200° C.

According to the present invention, the starting materials preferably employed for the amminolysis are hexaamminealuminum iodide, pentaamminealuminum iodide or hexaamminealuminum iodide monoammoniate.

According to the invention, the ammine salt of aluminum iodide can be transported out of the evaporation zone into the decomposition zone by means of an oxygen-free and water-free carrier gas.

According to the invention, it is possible to use ammonia, a nobel gas, nitrogen, hydrogen or mixture thereof as the carrier gas.

Good results are achieved if the evaporation and decomposition zones are operated at a pressure of 0.01 to 3 bar, the evaporation zone being kept at a temperature between 200° and 380° C., in particular between 350° and 370° C.

A variant of the process is when the ammine salt of aluminum iodide is formed in the evaporation zone by passing ammonia over aluminum iodide at a temperature of 200° to 380° C., in particular 350° to 370° C., and transported into the decomposition zone using excess ammonia as the carrier gas.

A process variant is when pentaamminealuminum iodide is evaporated in the evaporation zone at 350° to 380° C. in the absence of foreign gases and decomposed in the decomposition zone at 550° to 1200° C.

According to the invention, a transparent aluminum nitride coating is produced in which the crystallographic axis is perpendicular to the coating surface.

The orientation of the C axis was determined by X-ray photographs and by means of the behavior when observed in polarized light. Scanning electron photomicrographs have shown that the aluminum nitride coatings are pore-free and have a very smooth surface, the roughness of which is less than 0.3 µm, particularly less than 0.1 µm, in particular less than 0.01 µm.

Figure 2:
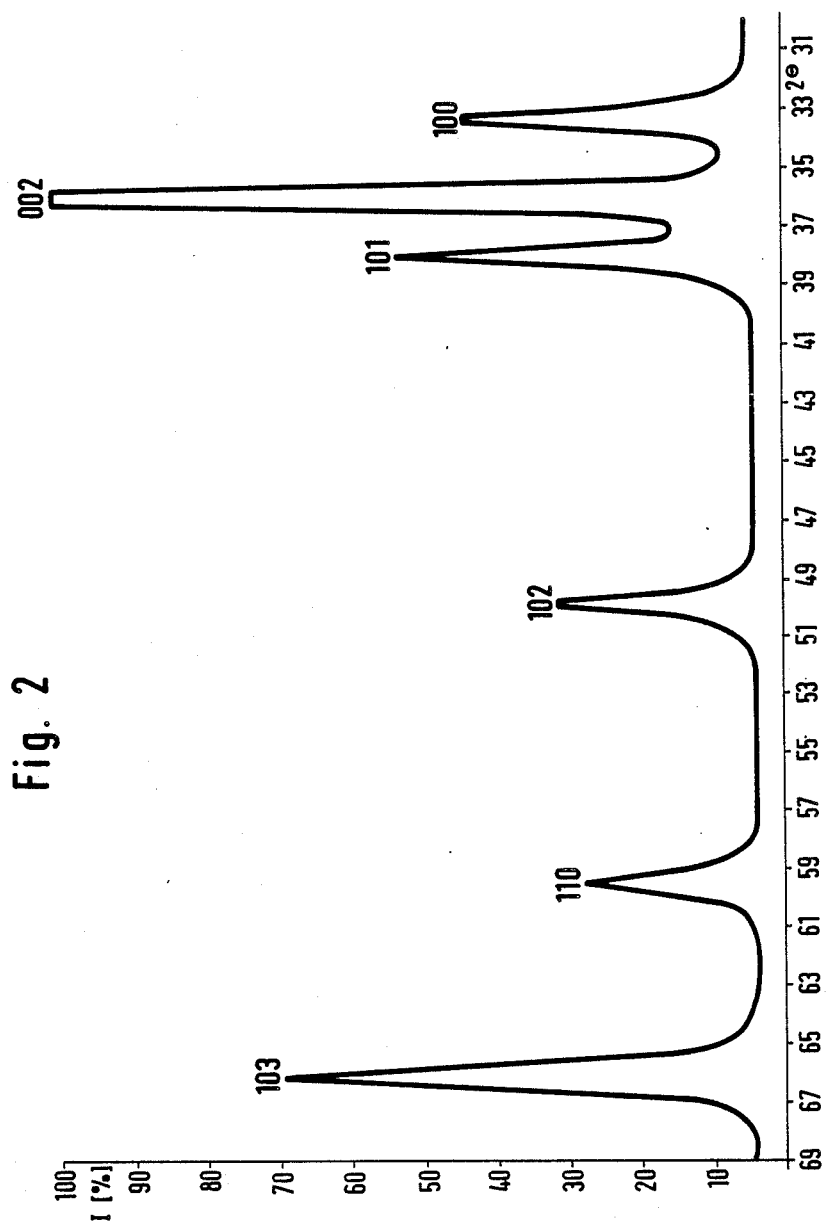

FIGS. 1 and 2 show X-ray photographs of the aluminum nitride. Only the 002 and 103 reflections can be seen in the X-ray photographs.

The examples below serve to illustrate the invention without representing a limitation.

EXAMPLE 1

Production of an aluminum nitride coating (starting material: Hexaamminealuminum iodide)

27 parts of aluminum turnings, 435 parts of ammonium iodide and 4 parts of ammonium chloride were placed in the autoclave under an inert gas ($N_2$, Ar). After evacuation, 580 parts of ammonia were condensed in. After sealing, the autoclave was heated to 120° C. and kept at a pressure of 90 bar for eight hours. The pressure was then reduced to atmospheric pressure at 120° C.

The product had the following analysis:

$Al_{0.181}$, $I_{0.591}$, $N_{1.156}$, $Cl_{0.015}$.

and thus corresponded to the formula $[Al(NH_3)_{6.0-4}]I_3 + 0.240\ NH_4I + 0.075\ NH_4Cl$.

Relative to aluminum, the yield was 92%.

The hexaamminealuminum iodide thus prepared was evaporated at 375° C. in a stream of $NH_3$ in a quartz tube. Aluminum oxide flakes were placed in the decomposition zone at 560° C. perpendicular to the direction of flow. When the reaction was complete, a coherent, pore-free aluminum nitride coating had formed on the $Al_2O_3$ flakes.

EXAMPLE 2

Production of an aluminum nitride coating (starting material in the evaporation zone: aluminum iodide)

Commercial $AlI_3$ supplied by Ventron, Karlsruhe, was distilled twice over aluminum supplied by VAW, Bonn. Aluminum iodide was evaporated at 350° C. in a quartz tube and reacted with $NH_3$ gas. The reaction product was transported into the decomposition zone by means of excess $NH_3$ and an aluminum nitride coating was produced therein on aluminum oxide flakes at 600° C. The aluminum nitride coating was coherent and pore-free.

We claim:

1. A process for the production of transparent aluminum nitride coatings, wherein the aluminum nitride coatings are obtained by evaporation of ammine salts of aluminum iodide in an evaporation zone and subsequent ammonolysis in a decomposition zone at temperatures above 550° and up to 1200° C.

2. The process as claimed in claim 1, wherein the starting material employed for the ammonolysis is hexaamminealuminum iodide or pentaamminealuminum iodide or hexaamminealuminum iodide monoammoniate.

3. The process as claimed in claim 1, wherein the ammine salt of aluminum iodide is transported out of the evaporation zone into the decomposition zone by means of an oxygen-free and water-free carrier gas.

4. The process as claimed in claim 3, wherein the carrier gas employed is ammonia, a noble gas, nitrogen, hydrogen or mixture thereof.

5. The process as claimed in claim 1, wherein the evaporation and decomposition zones are operated at a pressure of 0.01 to 3 bar, the evaporation zone being kept at a temperature between 250° and 380° C.

6. The process as claimed in claim 1, wherein the ammine salt of aluminum iodide is formed in the evaporation zone by passing ammonia over aluminum iodide at a temperature of 200° to 380° C. and transported into the decomposition zone using excess ammonia as the carrier gas.

7. The process as claimed in claim 1, wherein pentaamminealuminum iodide is evaporated in the evaporation zone at 350° to 380° C. in the absence of foreign gases and decomposed in the decomposition zone at temperatures above 550° and up to 1200° C.

* * * * *